United States Patent [19]
Dillman

[11] Patent Number: 5,473,250
[45] Date of Patent: Dec. 5, 1995

[54] HALL-EFFECT SENSOR HAVING REDUCED EDGE EFFECTS AND IMPROVED SENSITIVITY

[75] Inventor: Norman G. Dillman, Manhattan, Kans.

[73] Assignee: Hewlett-Packard Company, Palo Alto, Calif.

[21] Appl. No.: 193,970

[22] Filed: Feb. 9, 1994

[51] Int. Cl.⁶ .................... G01R 33/06; G01R 33/02; H01L 43/00
[52] U.S. Cl. .................... 324/251; 324/252; 327/511; 338/32 H
[58] Field of Search .................... 324/117 H, 117 R, 324/251, 252, 225; 338/32 H, 32 R; 327/510–513; 257/421, 423, 426, 427

[56] References Cited

U.S. PATENT DOCUMENTS 3,825,777  7/1974  Braun .................... 338/32 H X
4,607,271  8/1986  Popovic et al. .................... 324/252 X

FOREIGN PATENT DOCUMENTS 298905  of 1971  U.S.S.R. .................... 324/252

OTHER PUBLICATIONS

R. S. Popovic, *Hall Effect Devices*, Chapters 1–3, IOP Publishing Ltd., Bristol, England, 1991.

Primary Examiner—Sandra L. O'Shea
Assistant Examiner—Jay M. Patidar

[57] ABSTRACT

A Hall-effect sensor having a distributed array of current sources connected to an active region formed in a substrate of an integrated circuit. A corresponding array of current sinks is connected to the active region of the substrate opposite the current sources. When current flows in a path parallel to a first dimension of the active region from the current sources to the current sinks, a measurable Hall voltage develops across the active region if a magnetic field is passed through the sensor. This Hall voltage is measured by two terminals connected across a second dimension of the active region of the substrate. The measured Hall voltage sensitivity is very high according to this configuration.

15 Claims, 6 Drawing Sheets

HALL-EFFECT SENSOR HAVING REDUCED EDGE EFFECTS AND IMPROVED SENSITIVITY

BACKGROUND OF THE INVENTION

1. Field of the Invention

The present invention generally relates to the field of semiconductor devices, and more particularly, to Hall-effect sensors.

2. Related Art

Typically, Hall-effect sensors (hereafter called Hall sensors) are used to measure (1) static, transient or dynamic magnetic fields, (2) a current by measuring the magnetic field produced by the current, (3) a current passing through the sensor, or (4) material properties of the semiconductor in which the sensor is formed. Hall sensors are employed in a wide variety of applications including, for example, automotive, medical, power electronics, computer sensors, transducers, material characterization and power meters.

The well known Hall-effect is summarized in FIG. 1, which illustrates a circuit diagram of an N-type semiconductor material configured to produce the Hall-effect. A current, $I_{DC}$, is forced through the material by an external voltage, $V_{DC}$. An external magnetic field, B, applied perpendicular to the current $I_{DC}$ generates a "Hall voltage", $V_H$. The Hall voltage is produced as a result of the Lorentz force on a charge, e, moving through a perpendicular magnetic field with a velocity, v. The following equation shows the relationship of $I_{DC}$ to $V_H$, and $V_{DC}$ to $V_H$ in terms of the sensor size ratio, w/l (width, w, to length, l,):

$$\frac{V_H}{B} = \frac{I_{DC}}{qnt} = \mu_n V_{DC} \frac{w}{l} \qquad (1)$$

The Hall-effect can be obtained using both N-type and P-type semiconducting material. However, N-type semiconducting material is selected for most sensors because the mobility, μ (average velocity/electric field) is higher for electrons. For discussion purposes, N-type material will be assumed.

Further, background material concerning semiconductor solid-state physics may be found in a number of references including two books by S.M. Sze, titled: Physics of Semiconductor Devices, John Wiley and Sons, Inc., New York (1981), and Semiconductor Devices, Physics and Technology, John Wiley and Sons, Inc., New York (1985), both of which are incorporated herein by reference.

Boundary Limitations to Sensitivity

A significant limitation to conventional Hall sensors is that the contacts used to bias the sensor can "shunt" the Hall voltage if the length of the sensor, l, is much less than four times the width, w (e.g., w/l <0.25). This is shown in the graph of FIG. 2 which is adopted from Popovic, R.S., Hall Effect Devices, Chapters 1–3, IOP Publishing Ltd., Bristol, England, 1991. However, as the length-to-width ratio of the Hall sensor becomes smaller, as shown by curves 202, the ability to sense a Hall voltage (hereafter referred to as "the sensitivity") is reduced. This places a fundamental limit of the sensitivity for conventional Hall sensors. Thus, the geometry of the Hall sensor and the placement of the contacts on the sensor are important considerations.

For a material such as silicon where a typical electron mobility is 800 $cm^2/Vs$ (square centimeter/volt-second) and the applied voltage may be limited to 5 volts, the resulting sensitivity is limited to about 1,000 $cm^2/Vs$ or 0.1 V/T (volt/Tesla). Hall sensors have been developed using semiconductor materials with higher electron mobility and the ability to sustain higher voltages. From a manufacturing cost point of view, such higher electron mobility materials make it difficult to integrate the Hall sensor with signal processing circuitry, and the like, on the same chip.

Thus, what is needed is a Hall sensor capable of sensing weak magnetic fields at a much greater sensitivity level than conventional Hall sensors by reducing the shunting effect of the external power supply contacts.

SUMMARY OF THE INVENTION

The present invention is directed to a Hall-effect sensor. The present invention eliminates shunting of the Hall voltage associated with conventional Hall-effect sensors. Accordingly, the present invention produces significantly higher sensitivity and signal-to-noise ratios than previous Hall-effect sensors. For example, the present invention produces a sensitivity improvement at least 500 times that of conventional Hall-effect sensors.

The Hall-effect sensor of the present invention comprises a semiconductor substrate of material and a region formed therein having opposite conductivity type. The region has first and second width edges and first and second length edges. The region can be rectangular or serpentine, for example.

A plurality of current sources are electrically coupled to the region adjacent the first width edge and a plurality of current sinks are electrically coupled to the region adjacent the second width edge.

During operation, the current sources and the current sinks cause electrical currents to flow through the region in a lengthwise manner substantially perpendicular to the width. When a magnetic field is passed through a surface area of the region and the electrical currents are flowing through the region, a Hall voltage is generated in the region. The Hall voltage is detectable across first and second Hall voltage contacts. Because the current sources and sinks are distributed along the width edges of the region shunting of the Hall voltage is avoided. This benefit would not be realized using voltage source power supplies. The foregoing and other features and advantages of the present invention will be apparent from the following, more particular description of the preferred embodiments of the invention, as illustrated in the accompanying figures.

DETAILED DESCRIPTION OF THE PREFERRED EMBODIMENTS

The preferred embodiment of the present invention is discussed in detail below. While specific steps, configurations and arrangements are discussed, it should be understood that this is done for illustration purposes only. A person skilled in the relevant art will recognize that other steps, configurations and arrangements may be used without departing from the spirit and scope of the invention.

The preferred embodiment of the invention is now described with reference to the figures where like reference numbers indicate identical or functionally similar features. Also in the figures, the left-most digit of each reference number corresponds to the figure in which the reference number is first used.

Conceptually, the Hall sensor of the present invention comprises many Hall sensors configured in parallel, with the Hall voltage sensed in series across all of the sensors. Each Hall sensor is biased using a current (power) supply with an inherent high impedance to prevent shunting of the Hall voltage by the power supply contacts.

The inventor has discovered that inducing the current through the Hall sensor using a plurality of current sources rather than a voltage supply dramatically increases sensitivity. In this manner, the Hall voltage is less dependent of temperature. The Hall voltage resulting from constant current sources is inversely proportional to the density of the number of free carriers, which is approximately equal to the fixed impurity doping density. This is true over a range of a few hundred degrees for doping densities used in Hall sensors.

Figure 1:
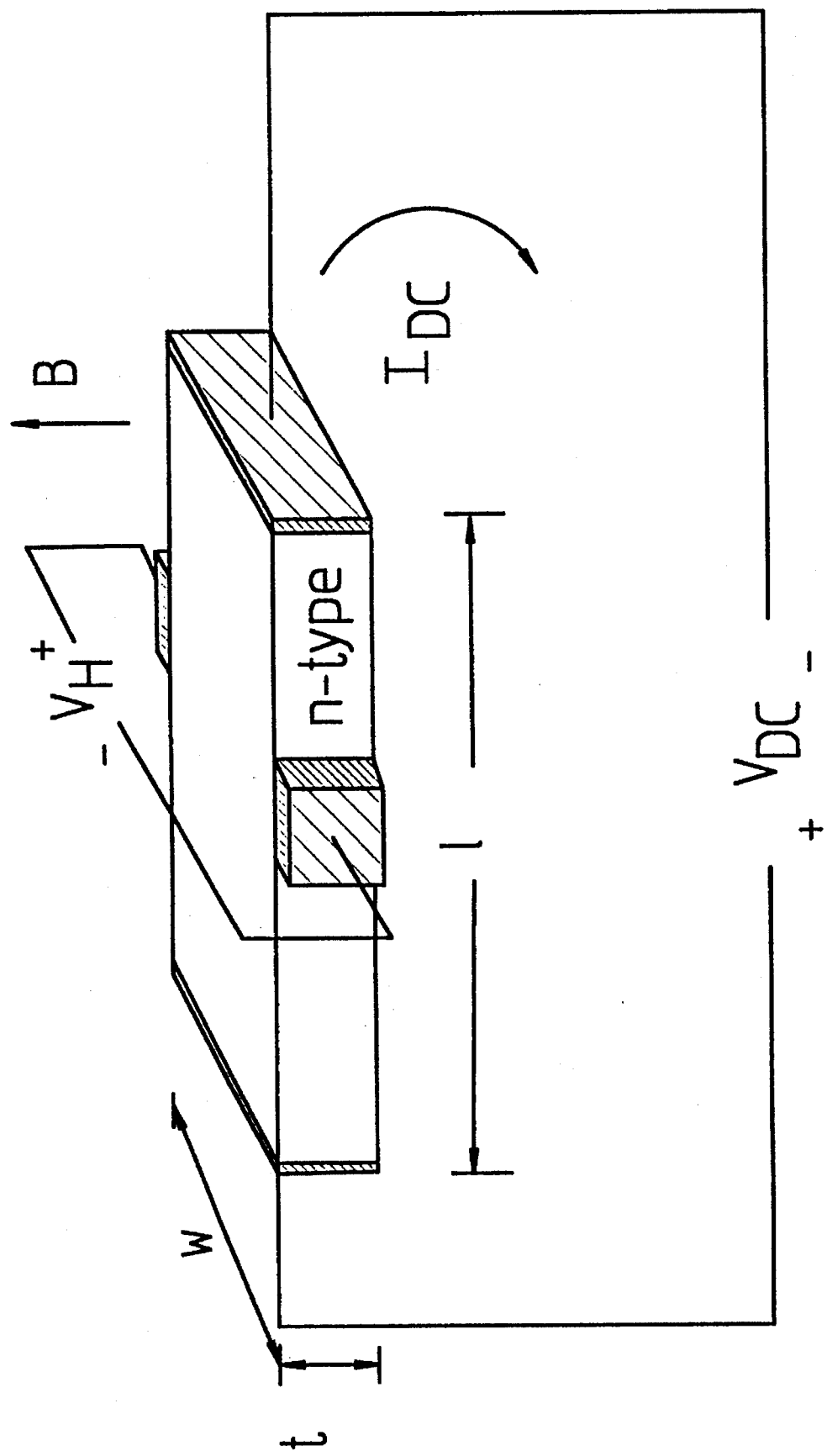
FIG. 1 shows a representative diagram of an N-type semiconductor material configured to demonstrate the Hall-effect.
Figure 2:
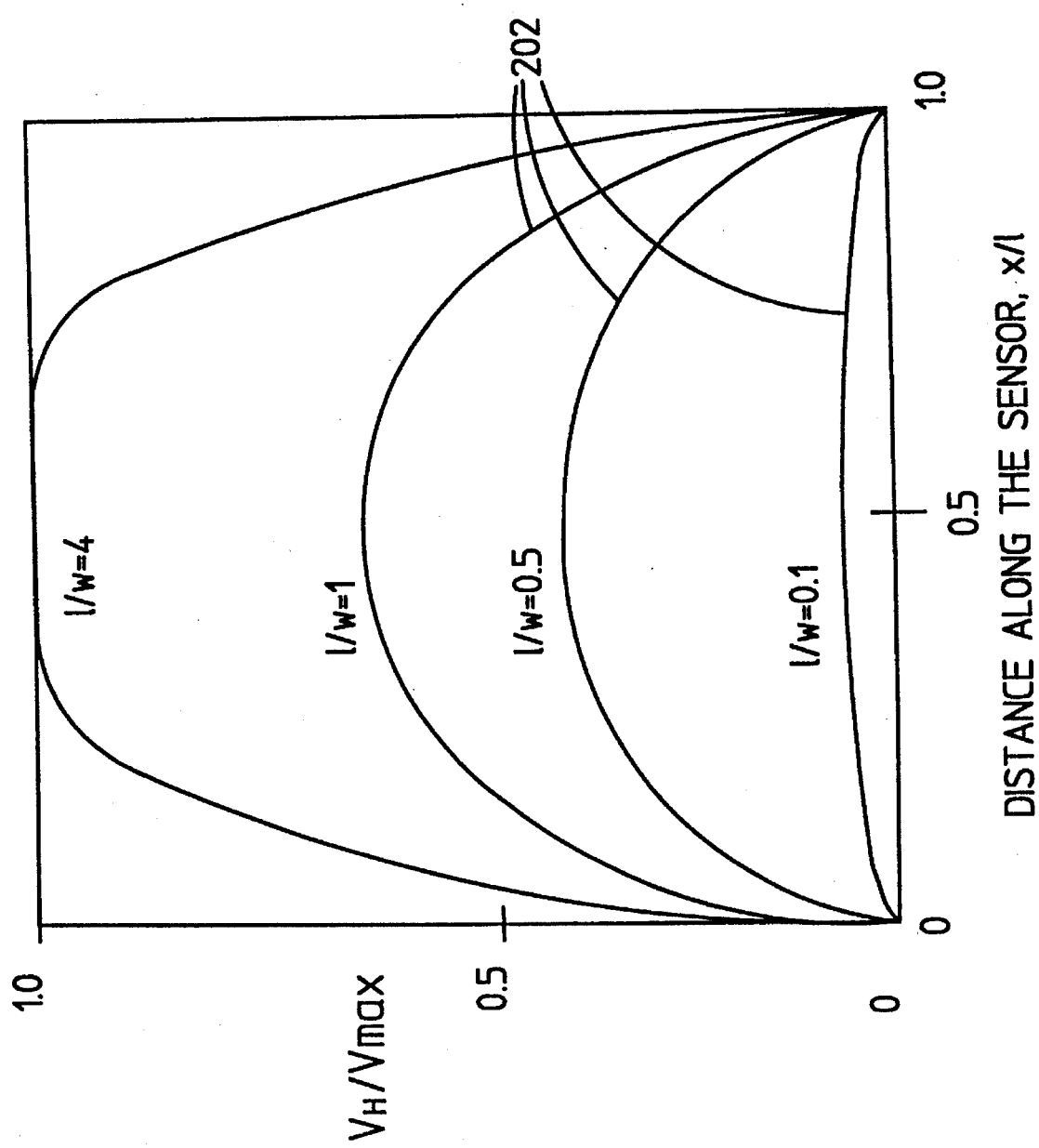
FIG. 2 is a graph depicting how the Hall voltage level is reduced due to the shunting effects of contacts for measuring the Hall-effect.
Figure 3:
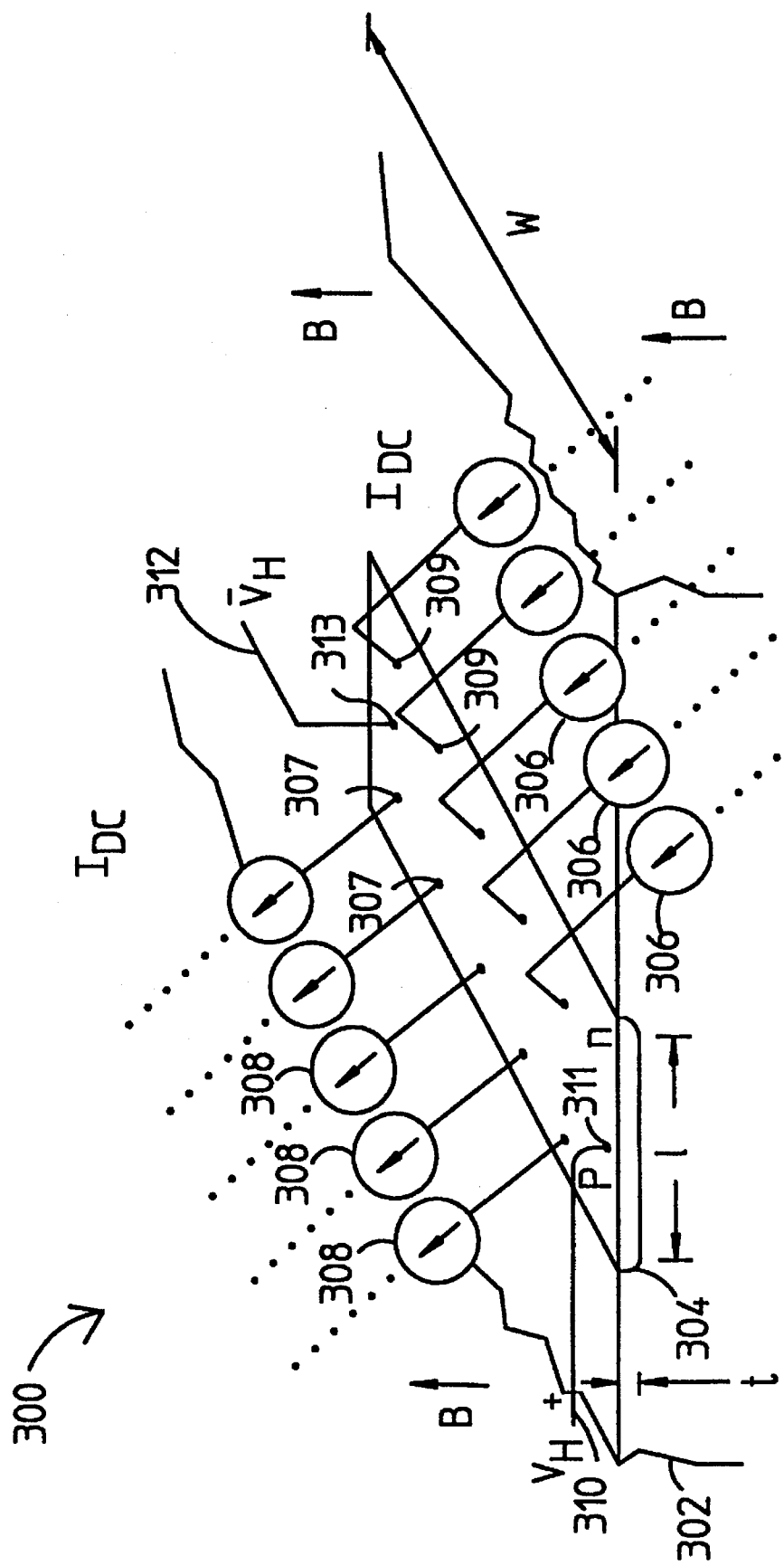
FIG. 3 shows a representative diagram of a Hall-effect sensor with distributed current sources and sinks according to the present invention.

FIG. 3 illustrates a representative diagram of a Hall-effect sensor with distributed current sources and sinks according to the present invention. A distributed Hall sensor 300 is formed on a substrate 302 and comprises a region 304 formed in the substrate 302. In a preferred embodiment of the invention, substrate 302 is P-type doped silicon and region 304 is N-type doped (i.e., they are of opposite conductivity type). Substrate 302 can be an epitaxial layer or a P-type well formed in an epitaxial separate layer, or the like, as would be apparent to a person skilled in the relevant art. Region 304 can be formed by diffusion, ion implantation or any known method as would also be apparent to a person skilled in the relevant art.

In the preferred embodiment of the present invention, thickness (t) of region 304 is up to about 1 μm, its width (w) is between 15–50 μm and its length (l) is between 3–10 mm. Each of these dimensions is dependent on manufacturing process parameters and are also implementation specific. The Hall sensor of the present invention can be serpentine-shaped, or the like, to facilitate more efficient layout.

The relative magnitudes of the width and length dimensions are reversed compared to conventional Hall sensors. These dimensions, according to the present invention, are to accommodate a plurality (i.e., a distributed array) of current sources 306 and complementary current sinks 308. 306 and 308 are symbolically shown as ideal current sources and sinks, respectively. It is important to note that each current source/sink 306/308 is electrically coupled to a respective width edge portion of region 304 via metal or silicide ohmic contacts, or the like (shown at 307 and 309, respectively). Each pair of current source/sink 306/308 is spaced apart by the length (l) such that during operation, a current is passed through region 304 between each current source/sink pair. The current sources 306 and the current sinks 308 are individually ohmically contacted to region 304. According to an aspect of the invention, this configuration permits the w/l ratio to be very large without shunting the Hall voltage $V_H$.

In one mode of operation, a total current, $I_{DC}$, is caused to flow through region 304 from, $V_{DC}$ to and via current sources 306 and current sinks 308. In the presence of a magnetic field B through the surface of region 304 (i.e., substantially perpendicular to substrate 302), a Hall voltage, $V_H$, is produced. The Hall voltage $V_H$ is measured differentially across a pair of Hall voltage contacts 310 and 312 via metal or silicide ohmic contacts, or the like (shown at 311 and 313, respectively). Hall voltage contacts 310 and 312 are located at opposite length edges of region 304.

Unlike conventional Hall sensors, which typically have a minimum width to maximize sensitivity, the contacts for current sources 306 and current sinks 308 do not shunt the $V_H$, contacts because the source resistance of the sources/sinks is very high. Typically, the equivalent resistance of a single current source 306 or current sink 308 of the present invention can range from 100 KΩ to 1 MΩ. This permits $V_H$ to develop along the entire width (w) to form a very wide active region within region 304, without $V_H$ being shunted by low resistance metal contacts.

The current sources 306 and current sinks 308 can be implemented on a separate chip or with discrete components, but an advantage is realized if they are integrated on the same substrate (chip) as sensor 300 using conventional integrated circuit fabrication techniques. This results in lower cost, better matching of current sources and permits inclusion of additional functions such as active filters, amplifiers, synchronous detectors, analog-to-digital converters and digital signal processing, or the like.

Sensitivity Comparison

Figure 4:
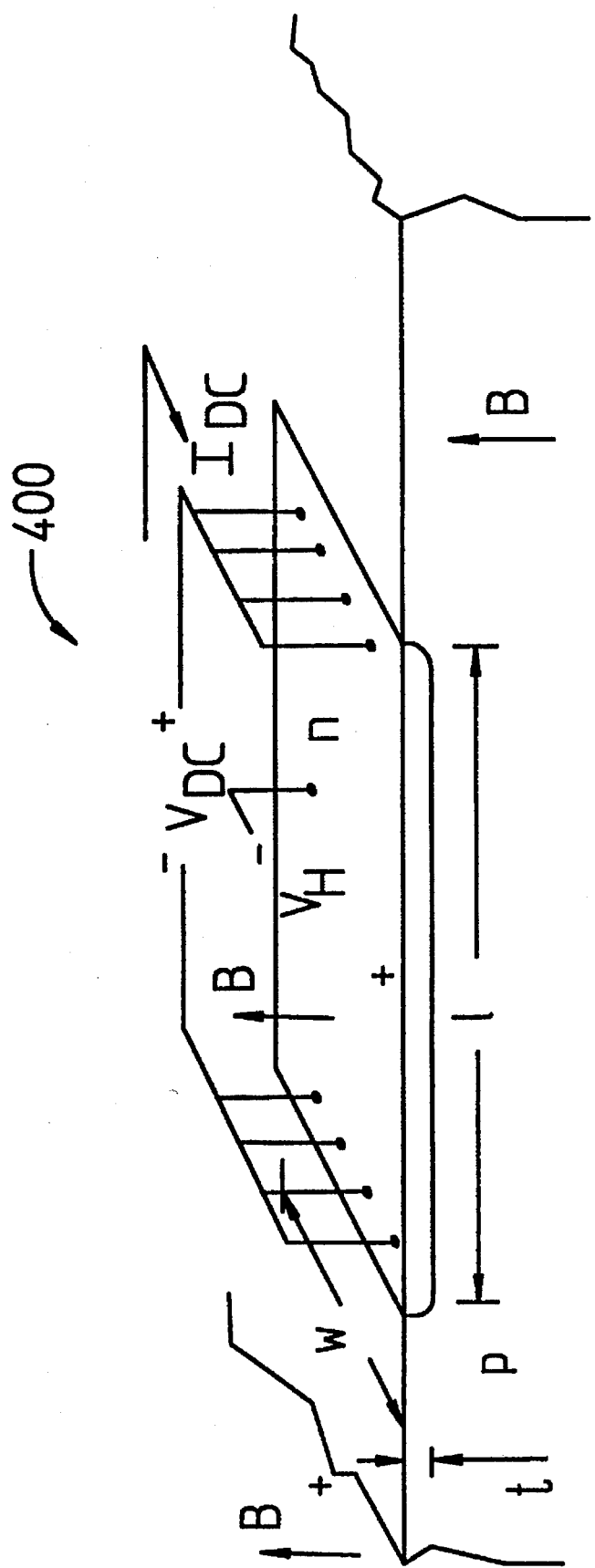
FIG. 4 is a diagram of a conventional Hall-effect device.

The superiority of the present invention over prior Hall sensors is illustrated by comparing the Hall sensor 300 with a conventional Hall sensor 400, shown in FIG. 4. Referring to FIG. 4, given $V_{DC} = 5$ V, l/w =4, and $\mu_n = 800$ cm²/Vs, the sensitivity of a conventional Hall sensor is:

$$\frac{V_H}{B} \cong \frac{\mu_n w V_{DC}}{l} = \frac{1000 \text{ cm}^3}{s} \ 0.1 \text{ V/T} \quad (2)$$

Now, referring to the Hall sensor 300 of FIG. 3, given $V_{DC} = 3.2$ (a smaller voltage is assumed for this embodiment, because the current sources require a small voltage drop), w/l =200 and $\mu_n = 800$ cm²/vs, the sensitivity of the sensor 300 is:

$$\frac{V_H}{B} \cong \frac{\mu_n w V_{DC}}{l} = 512,000 \text{ cm}^2/s \cong 50 \text{ V/T} \quad (3)$$

Therefore, Hall sensor 300 of the present invention produces a sensitivity factor improvement at least 500 times that of the conventional Hall sensor 400.

Reduced Thermal Noise

An additional feature of the present invention is that thermal noise is significantly reduced thus increasing the signal-to-noise ratio. The equivalent RMS thermal noise associated with the resistance of Hall sensors is defined as:

$$\frac{B_{noise}}{\sqrt{f}} = \frac{2}{V_{DC}\mu_n^{3/2}} \sqrt{\frac{(kT/q)}{(w/l)nt}} \quad (4)$$

Typical values for thermal noise in conventional Hall sensors is about 30 μGauss/(Hz)$^{1/2}$. (Note in the above equation that: f is frequency; k is the Boltzmann constant; T is temperature; q is the magnitude of electron charge; n is the carrier concentration in the region; t is the thickness of the region; and $\mu_n$ is the electron mobility. kT/q, the thermal voltage, is about 26 mV at room temperature (27° C.).)

From equation (3) above for sensitivity, for constant B, V, increases directly proportional to w/l. From equation (4) above for noise, the thermal noise decreases as the square root of w/l. Thus, for constant B, the signal-to-noise ratio increases proportional to $(w/l)^{3/2}$. For example, for constant B, as w/l increases by a factor of 4, the noise decreases by a factor of 2, and the signal-to-noise ratio increases by a factor of 8. Thus, the sensors of present invention achieve greater signal-to-noise ratios, compared to conventional sensors, because their w/l ratio is much larger.

Additional Embodiments

Figure 5:
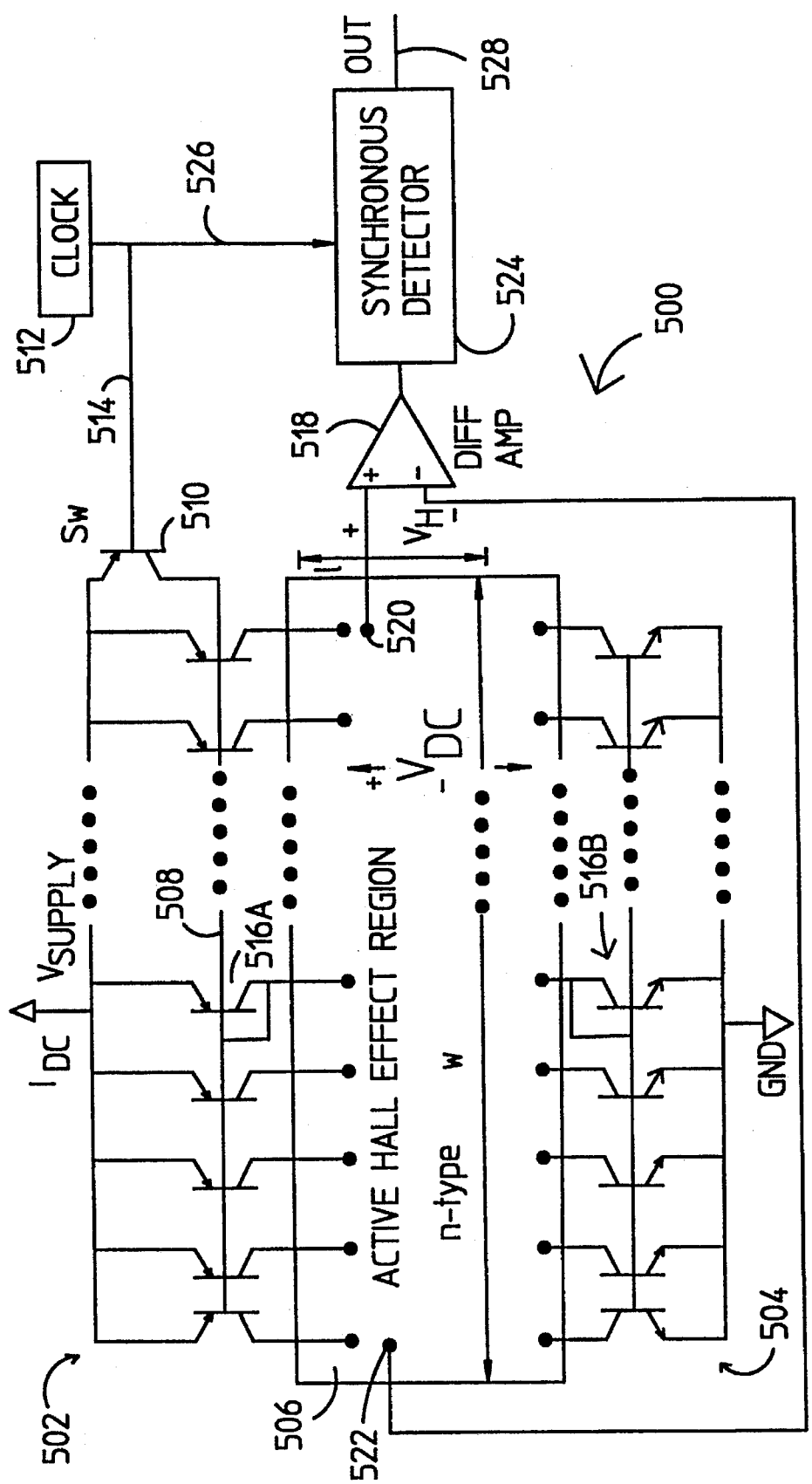
FIG. 5 shows a representative diagram of a Hall-effect sensor implemented with bipolar transistor distributed current sources and sinks according to a preferred embodiment of the present invention.

FIG. 5 illustrates a representative diagram of a Hall-effect sensor 500 where ideal current sources/sinks 306/308 are implemented with bipolar transistors, which are shown as distributed current source 502 and current sink 504. In this embodiment, an N-type active Hall-effect region is shown at 506. Current source 502 comprises a plurality of PNP bipolar transistors (called current mirrors) having their emitters electrically coupled to a DC supply voltage ($V_{supply}$) and their collectors electrically coupled to the region 506. Current sink 504 comprises a plurality of NPN bipolar transistors (also called current mirrors) having their emitters electrically coupled to a DC ground (Gnd) and their collectors electrically coupled to the region 506. A total of between about 100 and 200 pairs of PNP and NPN transistors is preferred. The electrical connections of the PNP and NPN transistors to the region 506 are the same as described above in connection with FIG. 3.

In an exemplary mode of operation in which region 506 is positioned in a magnetic field having its orientation perpendicular to the surface of region 506, the intensity of the field can be measured. This is done by passing a current $I_{DC}$ from $V_{supply}$ to Gnd through region 506 using the current source 502 and current sink 504.

Specifically, the respective bases of transistors 516A and 516B are connected to their respective collectors and are thus configured as diodes. In this manner, transistors 516A and 516B establish the voltage $V_{DC}$. This also establishes the current that the remaining transistors mirror. The PNP transistors have their bases (shown collectively at 508) coupled to the collector of a PNP switch 510. The emitter of switch 510 is coupled to $V_{supply}$ and its base is controlled by a clock signal generated by a clock 512 via a line 514. Switch 510 controls the time periods when current $I_{DC}$ flows from $V_{supply}$ to Gnd. This is desirable so that AC amplifiers and synchronous detectors can be used to detect static or slowly varying magnetic fields.

In the presence of the magnetic field to be measured, for example, when switch 510 is "on" and current $I_{DC}$ flows thorough region 506 a Hall voltage, $V_H$, is produced. $V_H$ is amplified via an A.C. differential amplifier 518 coupled to two Hall voltage contacts 520 and 522 of the Hall sensor 500. If no synchronous detection/clocking is performed, a chopper-stabilized differential D.C. amplifier can be used.

A synchronous detector 524 (or the like) receives the clock signal via line 526. An input of synchronous detector 524 is coupled to an output of differential amplifier 518. Synchronous detector 524 produces the output (OUT) 528 representing $V_H$, which is a function of the magnitude of the applied magnetic field.

Temperature Dependence

For conventional power supplies providing a bias voltage, the mobility of the current carriers (i.e., electron mobility or hole mobility) and, hence, the Hall voltage is temperature dependent. This relation can be derived by inspection of equation (1) above. Mobility varies as $T^{-3/2}$ at high temperatures where lattice scattering dominates mobility and as $T^{+3/2}$ at lower temperatures where impurity scattering dominates mobility. For lightly doped material used for Hall sensors, the variation is always proportional to $T^{-3/2}$ for temperatures of practical applications. This means that the temperature sensitivity of the hole voltage with an applied voltage supply is about −0.5%/°C. (percent per degree Celsius) at room temperature.

Figure 6:
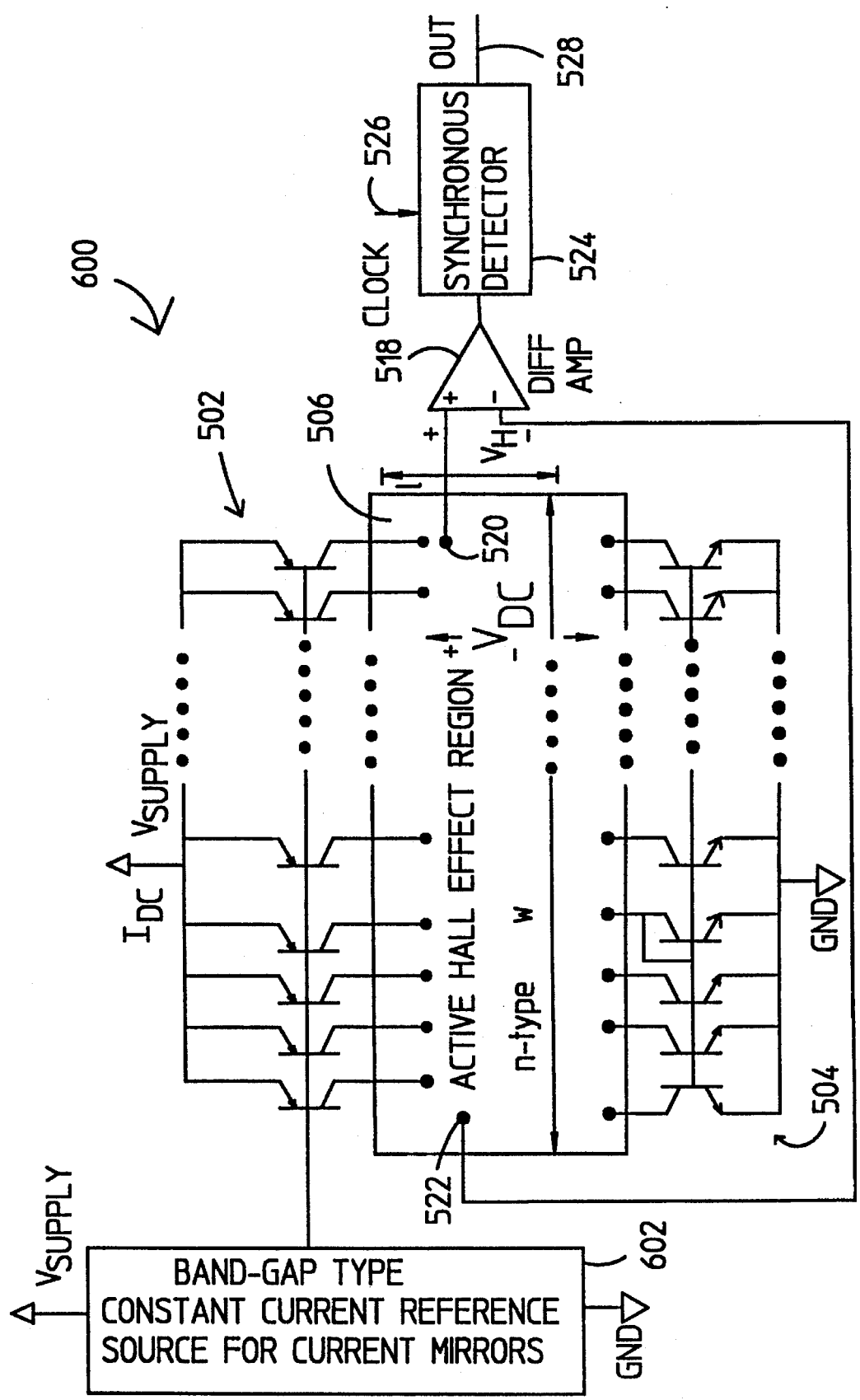
FIG. 6 shows a representative diagram of a Hall-effect sensor implemented with distributed constant current sources according to an alternative embodiment of the present invention.

FIG. 6 shows a representative diagram of a Hall-effect sensor 600 implemented with distributed constant current sources according to an alternative embodiment of the present invention. According to this embodiment, the Hall sensor is less sensitive to temperature changes, because of the constant current sources. $V_{AC}$ of constant current sources causes the Hall voltage to be independent of μ (carrier mobility) as indicated by equation (1) above. The carrier concentration n is the important factor when using constant current source(s) because it is relatively constant over a wide temperature range.

The current sources 502 and current sinks 504 are controlled by a conventional band-gap reference source 602. This results in a significantly reduced temperature sensitivity. Other circuits which produce a current can be substituted for the band-gap type constant current reference 602. For example, the reference current $I_{DC}$ generator can be implemented by a low temperature coefficient resistor (not shown) and a fixed voltage source. The sensor 600 operates the same as sensor 500 shown in FIG. 5.

Similar implementations of the distributed Hall sensor can be realized by reversing the conductivity types of the substrate and active region or by substituting conventional metal-oxide-semiconductor field-effect transistors (MOS-FETs) for the bipolar transistors. This latter modification would result in a slightly larger voltage drop across the current sources, thus decreasing the current that can be pumped through the sensor region resulting in somewhat lower sensitivity. The MOSFET implementations can be realized by substituting PMOS devices for the PNP bipolar transistors and NMOS devices for NPN bipolar transistors. Switching circuits can be added to reverse the direction of current to improve sensor performance.

It should be noted that the examples can easily be implemented according to known fabrication processes. In fact, sensitivity factors could be made much larger, limited only by noise and power dissipation limits, and maximum and minimum geometry limits. The latter limiting factors also impact the manufacturing yield. Also, present and future materials having higher majority carrier-mobility and power dissipation than silicon could be used to improve sensitivity even more.

While various embodiments of the present invention have been described above, it should be understood that they have been presented by way of example, and not limitation. It will be apparent to persons skilled in the relevant art that various changes in form and detail can be made therein without departing from the spirit and scope of the invention. Thus the present invention should not be limited by any of the above-described exemplary embodiments, but should be defined only in accordance with the following claims and their equivalents. All cited patent documents and publications in the above description are incorporated herein by reference.

What is claimed is:

1. A Hall-effect sensor, comprising:
   a layer of semiconductor material of a first conductivity type;
   a region formed in said layer of a second conductivity type, wherein said region has first and second width edges and first and second length edges;
   a plurality of current sources electrically coupled to said region adjacent said first width edge;
   a plurality of current sinks electrically coupled to said region adjacent said second width edge,
   wherein during operation, said current sources and said current sinks cause electrical currents to flow through said region in a lengthwise manner substantially perpendicular to said width;
   a first Hall voltage contact electrically coupled to said region adjacent said first length edge; and
   a second Hall voltage contact electrically coupled to said region adjacent said second length edge,
   wherein during operation, when a magnetic field is passed through said region and said electrical currents are flowing through said region, a Hall voltage is generated in said region, said Hall voltage being detectable using said first and second Hall voltage contacts.

2. The Hall-effect sensor of claim 1, wherein said width is substantially larger than said length.

3. The Hall-effect sensor of claim 1, wherein said first conductivity type is opposite of said second conductivity type.

4. The Hall-effect sensor of claim 1, wherein said first conductivity type is P-type and said second conductivity type is N-type.

5. The Hall-effect sensor of claim 1, wherein said plurality of current sources and said plurality of current sinks comprise transistors.

6. The Hall-effect sensor of claim 5, wherein the sensor and said transistors are integrated on a single chip.

7. The Hall-effect sensor of claim 6, wherein said transistors are configured as current mirrors.

8. The Hall-effect sensor of claim 1, further comprising an amplifier coupled to said first and second Hall voltage contacts for producing an amplified signal of said Hall voltage.

9. The Hall-effect sensor of claim 8, wherein the sensor and said amplifier are integrated on a single chip.

10. The Hall-effect sensor of claim 9, wherein said amplifier is a differential amplifier.

11. The Hall-effect sensor of claim 10, further comprising:
    a synchronous detector coupled to an output of said differential amplifier; and
    a clock coupled to, and for synchronizing said transistors and said synchronous detector.

12. The Hall-effect sensor of claim 1, wherein said semiconductor material comprises silicon.

13. The Hall-effect sensor of claim 1, wherein said semiconductor material has high carrier mobility.

14. The Hall-effect sensor of claim 1, wherein said second width edge is substantially parallel to said first width edge and said second length edge is substantially parallel to said first length edge.

15. The Hall-effect sensor of claim 1, wherein the sensor has a serpentine shape.

* * * * *